US012764888B2

(12) United States Patent
Xu et al.

(10) Patent No.: US 12,764,888 B2
(45) Date of Patent: Oct. 13, 2026

(54) ELECTRONIC DEVICE AND TRAY

(71) Applicant: Wistron Corporation, New Taipei City (TW)

(72) Inventors: Wei Xu, New Taipei City (TW); Hua-Jun Liang, New Taipei City (TW); Jun Hao Wang, New Taipei City (TW); Zhaoping Fu, New Taipei City (TW); Zhong-Hui Mao, New Taipei City (TW); Chih-Yao Chou, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 311 days.

(21) Appl. No.: 18/656,539

(22) Filed: May 6, 2024

(65) Prior Publication Data

US 2025/0247991 A1 Jul. 31, 2025

(30) Foreign Application Priority Data

Jan. 29, 2024 (CN) ......................... 202410126027.9

(51) Int. Cl.
*H05K 7/20* (2006.01)
*H05K 7/14* (2006.01)

(52) U.S. Cl.
CPC ......... *H05K 7/1489* (2013.01); *H05K 7/1415* (2013.01)

(58) Field of Classification Search
CPC ... H05K 7/1401; H05K 7/1415; H05K 7/1489
See application file for complete search history.

(56) References Cited

U.S. PATENT DOCUMENTS

| | | | | |
|---|---|---|---|---|
| 10,251,300 | B1 * | 4/2019 | Mao | H05K 7/1487 |
| 10,564,685 | B2 * | 2/2020 | Chen | G06F 1/185 |
| 10,827,641 | B1 * | 11/2020 | Shen | H05K 7/20709 |
| 11,310,932 | B2 * | 4/2022 | Chang | H05K 7/16 |
| 2015/0070858 | A1 * | 3/2015 | Wu | H05K 7/1417 361/807 |
| 2017/0196107 | A1 * | 7/2017 | Chen | F16M 13/022 |
| 2018/0329463 | A1 * | 11/2018 | Liu | G06F 1/182 |
| 2023/0328908 | A1 * | 10/2023 | Tan | H05K 5/0221 |
| 2025/0275080 | A1 * | 8/2025 | Lee | H05K 7/1489 |

* cited by examiner

*Primary Examiner* — Anthony Q Edwards
(74) *Attorney, Agent, or Firm* — Winston Hsu

(57) ABSTRACT

An electronic device includes a casing and a tray. The tray includes a tray body, a handle, a first transmission mechanism, a second transmission mechanism and a third transmission mechanism. The tray body is disposed in the casing. The first transmission mechanism is configured to rotatably connect the handle to the tray body. The second transmission mechanism is disposed on the tray body and connected to the first transmission mechanism. The third transmission mechanism is disposed on the tray body and corresponds to the second transmission mechanism. When the handle rotates, the first transmission mechanism drives the second transmission mechanism to move along a first direction, and the second transmission mechanism drives the third transmission mechanism to move along a second direction perpendicular to the first direction.

20 Claims, 16 Drawing Sheets

ELECTRONIC DEVICE AND TRAY

BACKGROUND OF THE INVENTION

1. Field of the Invention

The disclosure relates to an electronic device and a tray and, more particularly, to a tray capable of being assembled or disassembled conveniently and an electronic device equipped with the tray.

2. Description of the Prior Art

The current structural design of servers often fixes an electronic module (e.g. graphics processing unit (GPU)) on a tray, and then assembles the tray to a casing of a chassis. When the tray is put into the casing of the chassis, multiple electrical connectors of the electronic device need to be respectively connected to multiple electrical connectors of different modules. At present, the prior art relies on manual work to connect multiple sets of electrical connectors, which is not only difficult to operate, but also inefficient in disassembly and assembly.

SUMMARY OF THE INVENTION

The disclosure provides a tray capable of being assembled or disassembled conveniently and an electronic device equipped with the tray, so as to solve the aforesaid problems.

According to an embodiment of the disclosure, an electronic device comprises a casing and a tray. The tray comprises a tray body, a handle, a first transmission mechanism, a second transmission mechanism and a third transmission mechanism. The tray body is disposed in the casing. The first transmission mechanism is configured to rotatably connect the handle to the tray body. The second transmission mechanism is disposed on the tray body and connected to the first transmission mechanism. The third transmission mechanism is disposed on the tray body and corresponds to the second transmission mechanism. When the handle rotates, the first transmission mechanism drives the second transmission mechanism to move along a first direction, and the second transmission mechanism drives the third transmission mechanism to move along a second direction perpendicular to the first direction.

According to another embodiment of the disclosure, a tray comprises a tray body, a handle, a first transmission mechanism, a second transmission mechanism and a third transmission mechanism. The first transmission mechanism is configured to rotatably connect the handle to the tray body. The second transmission mechanism is disposed on the tray body and connected to the first transmission mechanism. The third transmission mechanism is disposed on the tray body and corresponds to the second transmission mechanism. When the handle rotates, the first transmission mechanism drives the second transmission mechanism to move along a first direction, and the second transmission mechanism drives the third transmission mechanism to move along a second direction perpendicular to the first direction.

As mentioned in the above, the disclosure may dispose a first electrical connector and a second electrical connector on the casing, dispose a third electrical connector on the tray body of the tray, and dispose a fourth electrical connector on the third transmission mechanism of the tray, wherein the third electrical connector corresponds to the first electrical connector and the fourth electrical connector corresponds to the second electrical connector. When a user puts the tray into the casing, the user may rotate the handle from the first position toward the second position. At this time, the first transmission mechanism drives the second transmission mechanism to move along the first direction, such that the third electrical connector is connected to the first electrical connector. Then, the user may rotate the handle from the second position toward the third position. At this time, the first transmission mechanism drives the second transmission mechanism to move along the first direction and the second transmission mechanism drives the third transmission mechanism to move along the second direction, such that the fourth electrical connector is connected to the second electrical connector. On the other hand, when the user wants to disassemble the tray from the casing, the user may first rotate the handle from the third position toward the second position to separate the fourth electrical connector from the second electrical connector, and then rotate the handle from the second position toward the first position to separate the third electrical connector from the first electrical connector. Accordingly, the user can conveniently and rapidly assemble and disassemble the tray.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
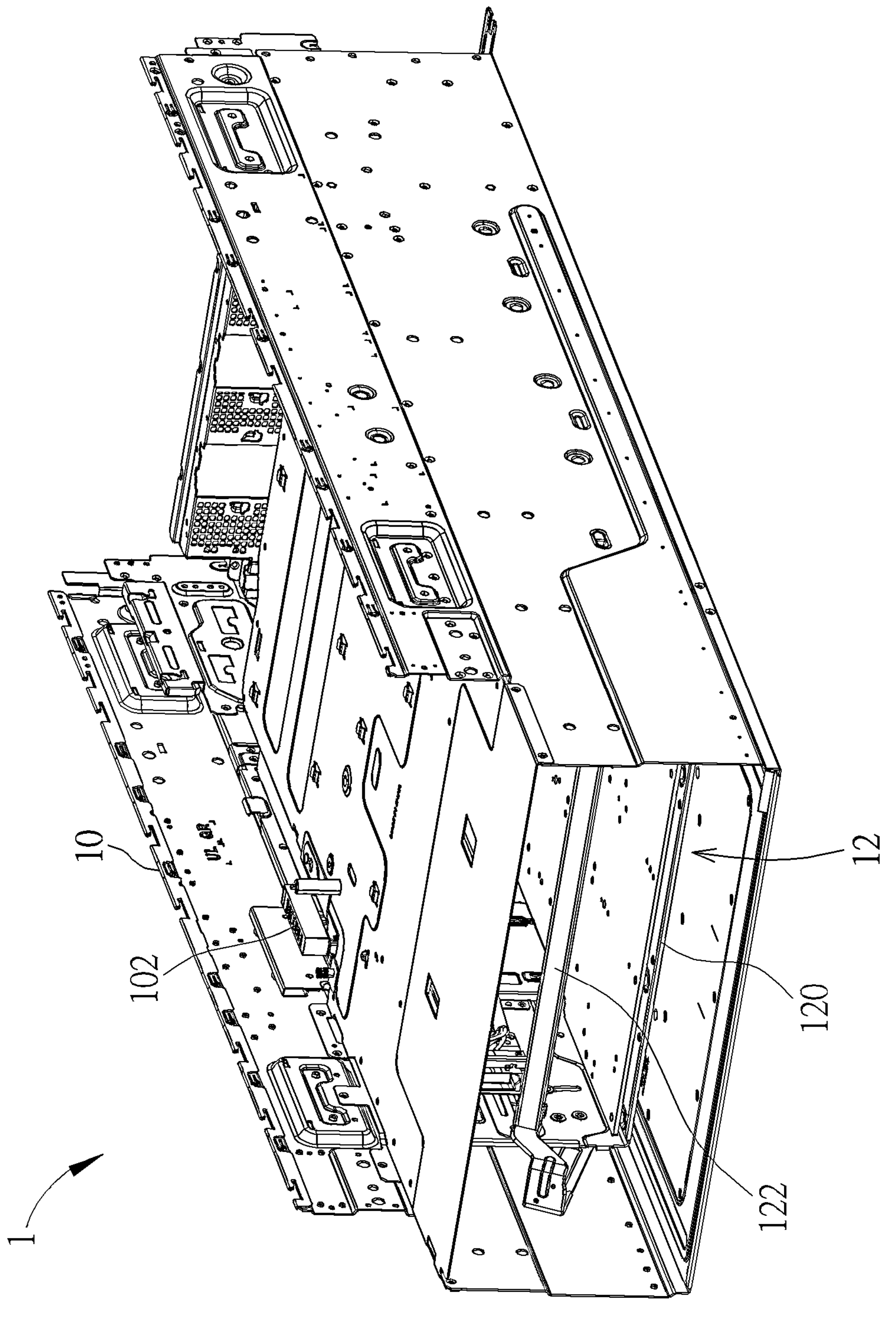
FIG. 1 is a perspective view illustrating an electronic device according to an embodiment of the disclosure.
Figure 2:
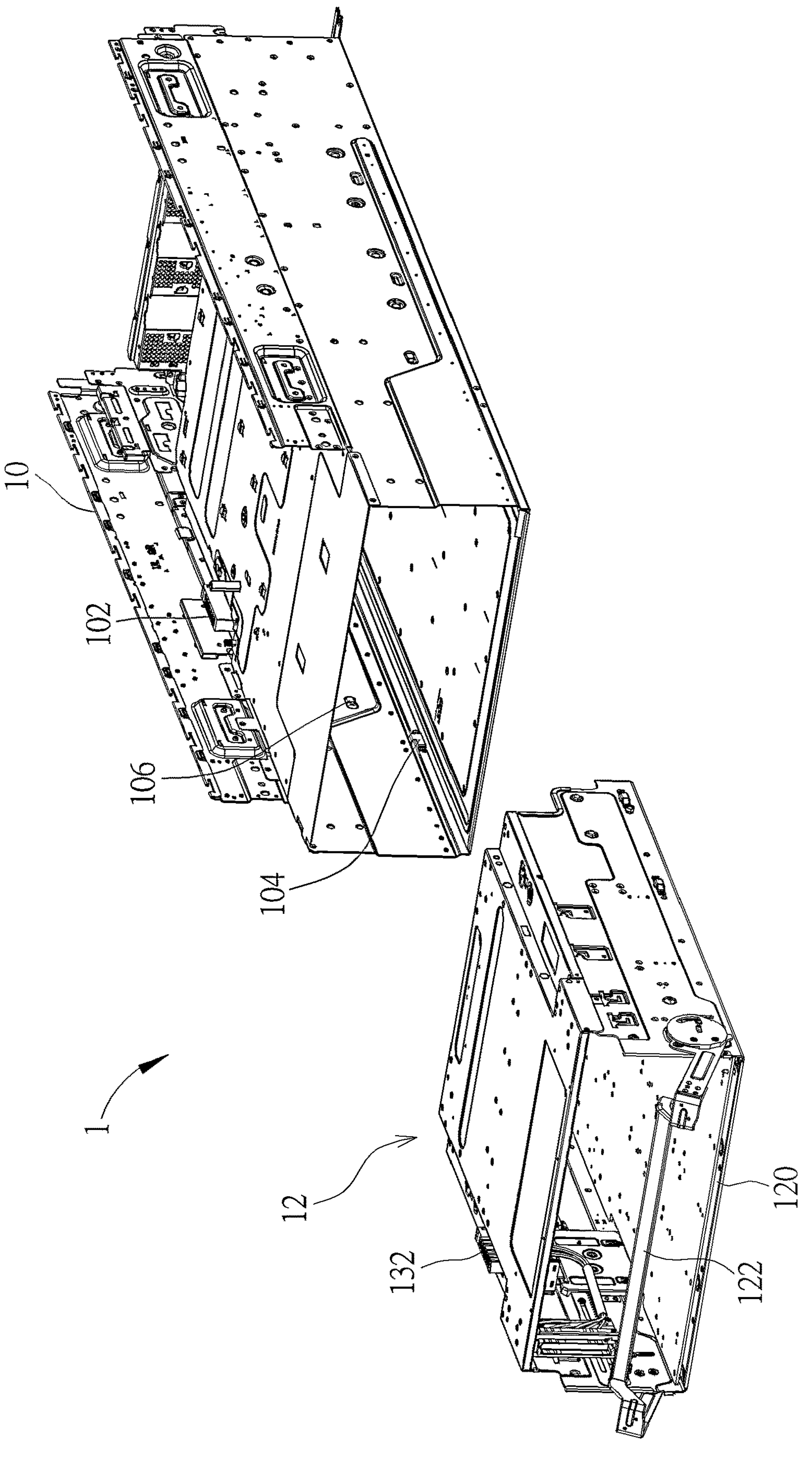
FIG. 2 is an exploded view illustrating the electronic device shown in FIG. 1.
Figure 3:
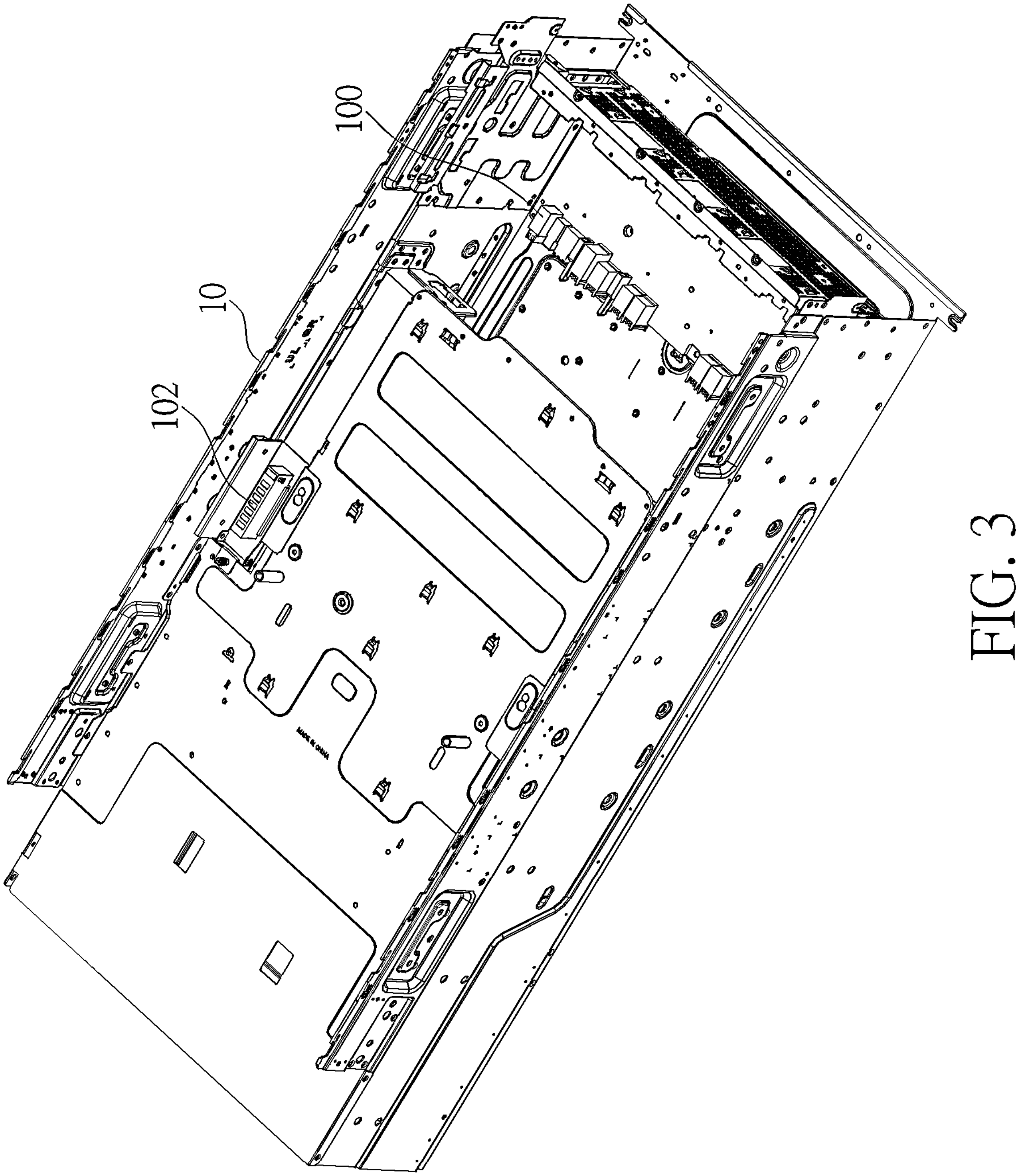
FIG. 3 is a perspective view illustrating a casing shown in FIG. 2 from another viewing angle.
Figure 4:
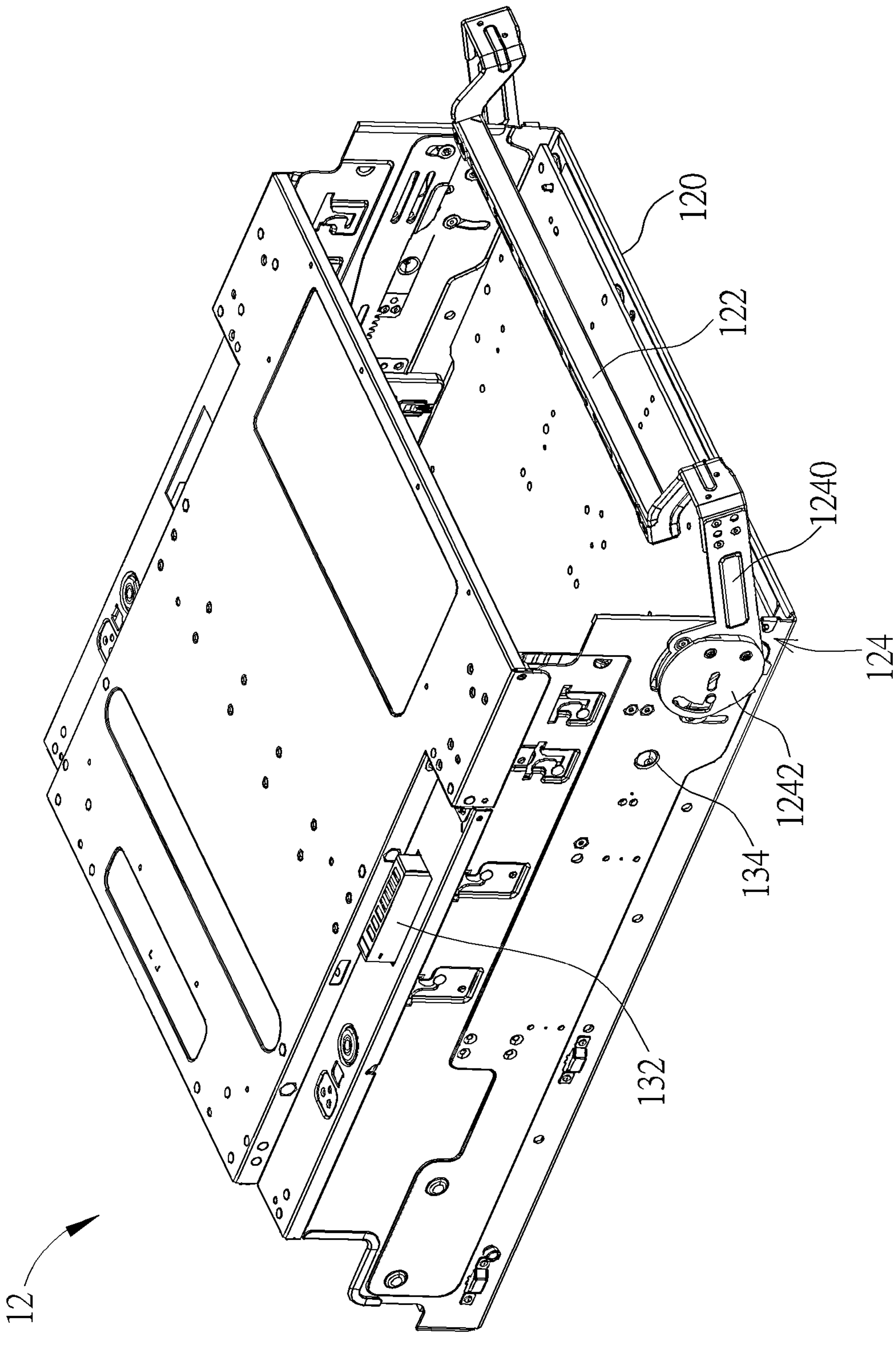
FIG. 4 is a perspective view illustrating a tray shown in FIG. 2 from another viewing angle.
Figure 5:
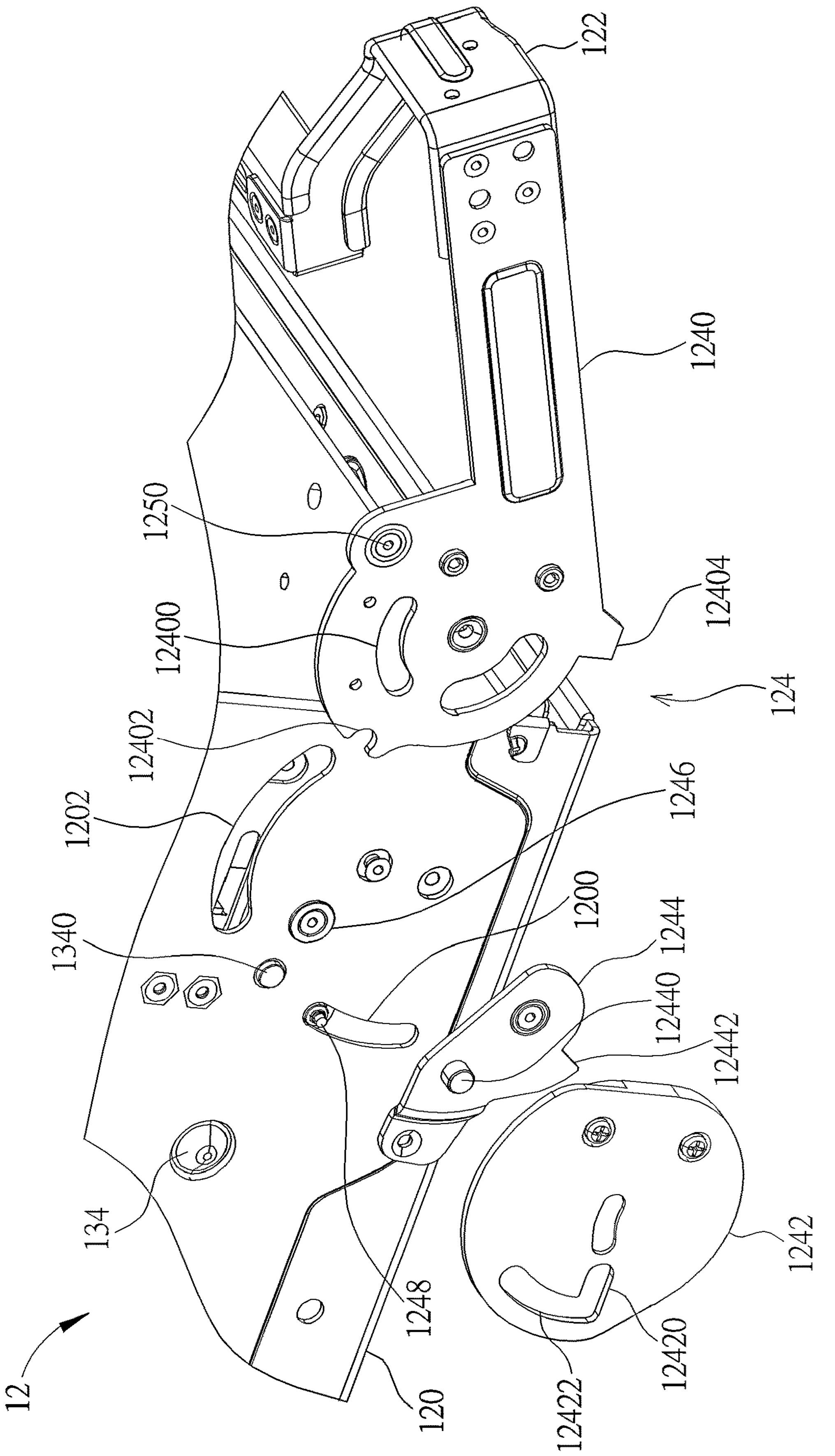
FIG. 5 is a partial exploded view illustrating the tray shown in FIG. 4.
Figure 6:
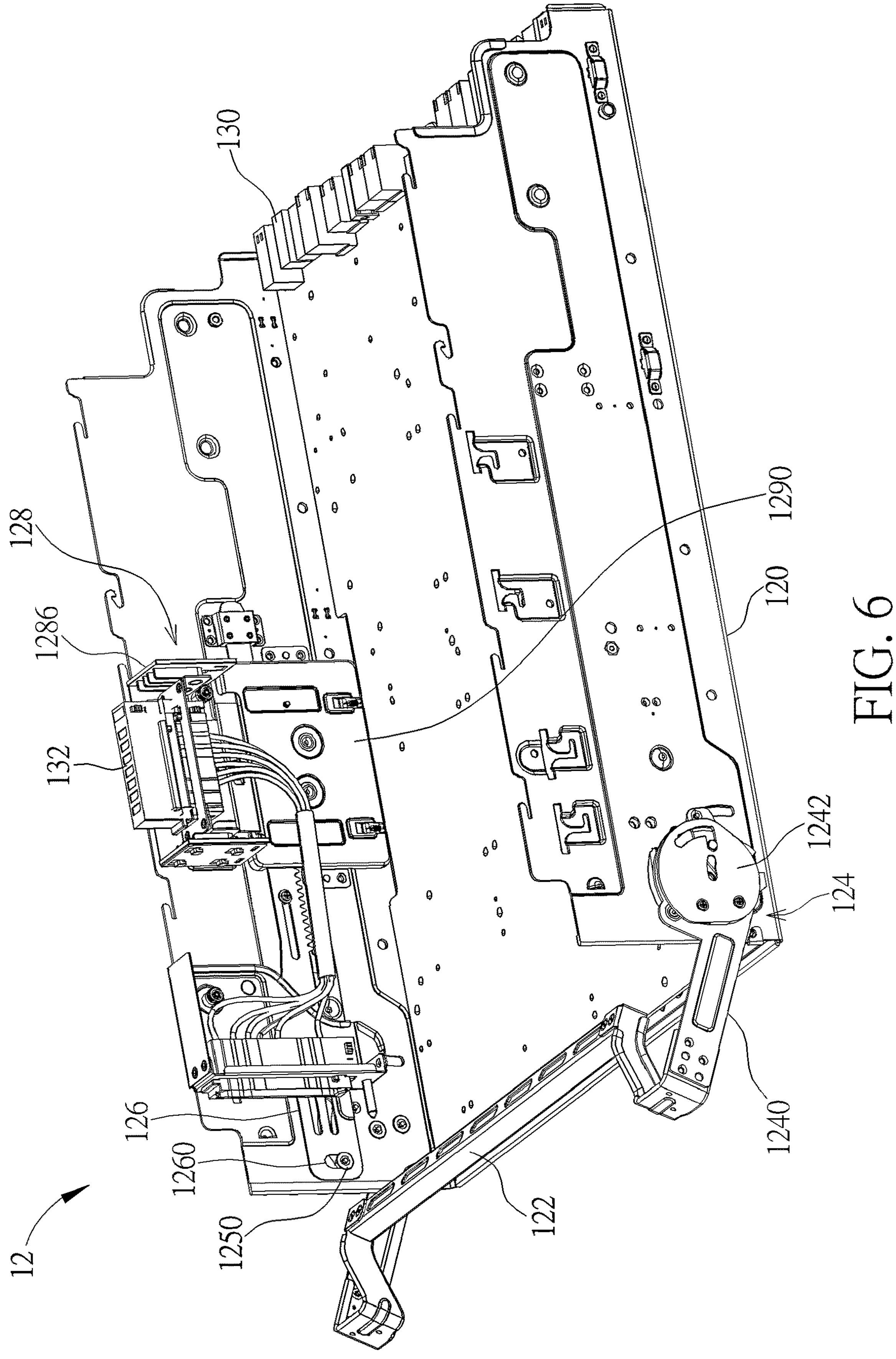
FIG. 6 is an inside view illustrating the tray shown in FIG. 4.
Figure 7:
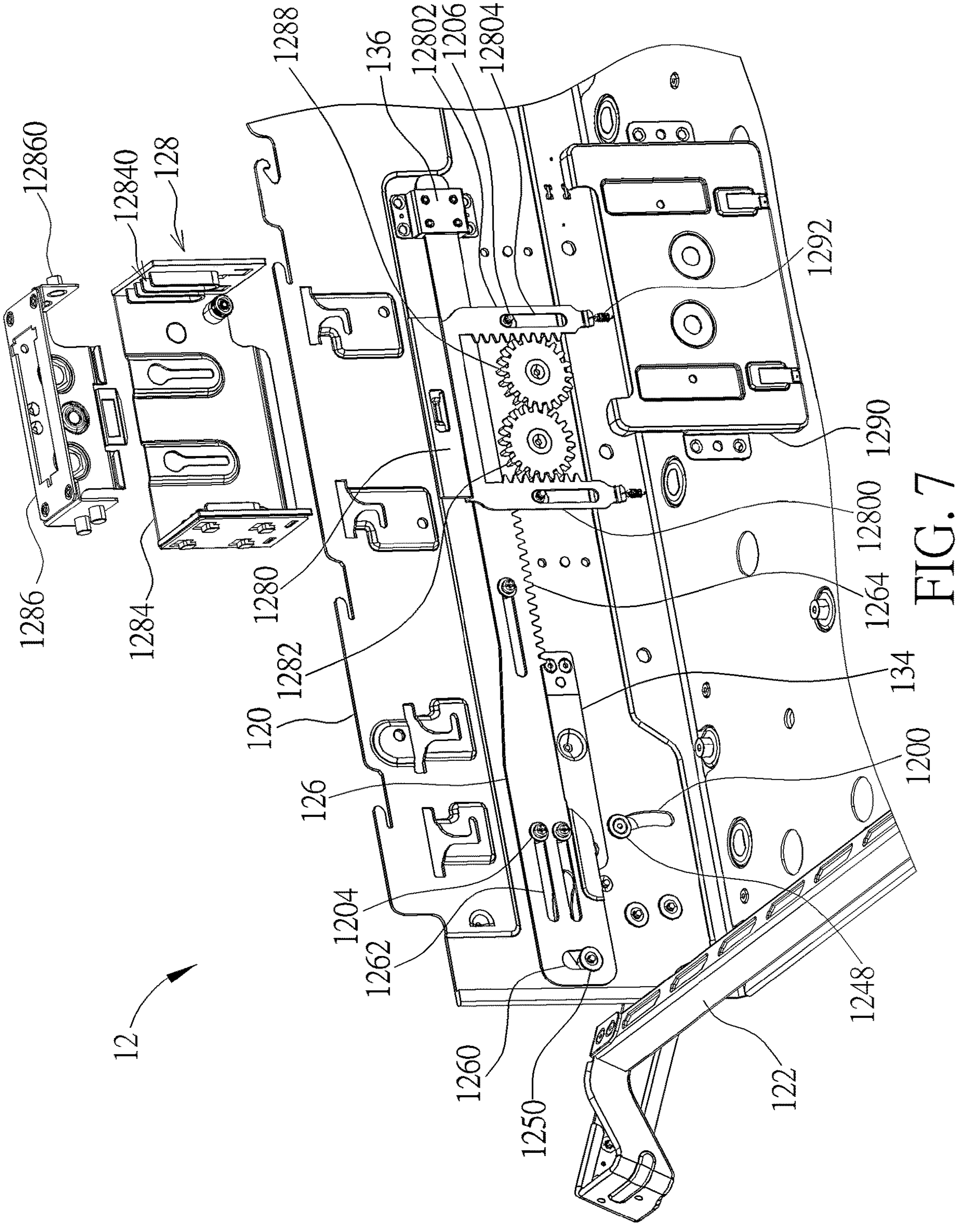
FIG. 7 is a partial exploded view illustrating the tray shown in FIG. 6.
Figure 8:
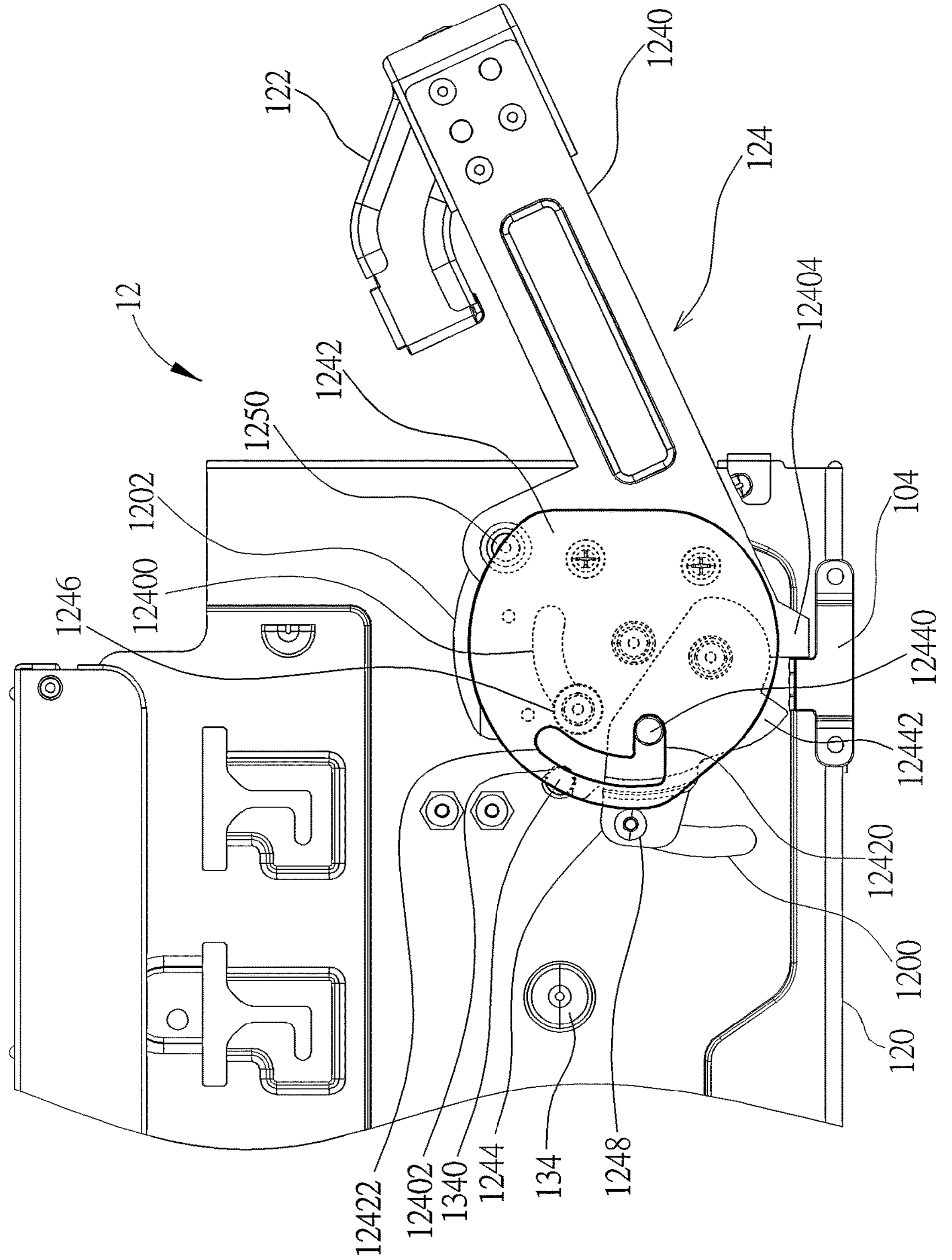
FIG. 8 is an outside view illustrating a handle located at a first position.
Figure 9:
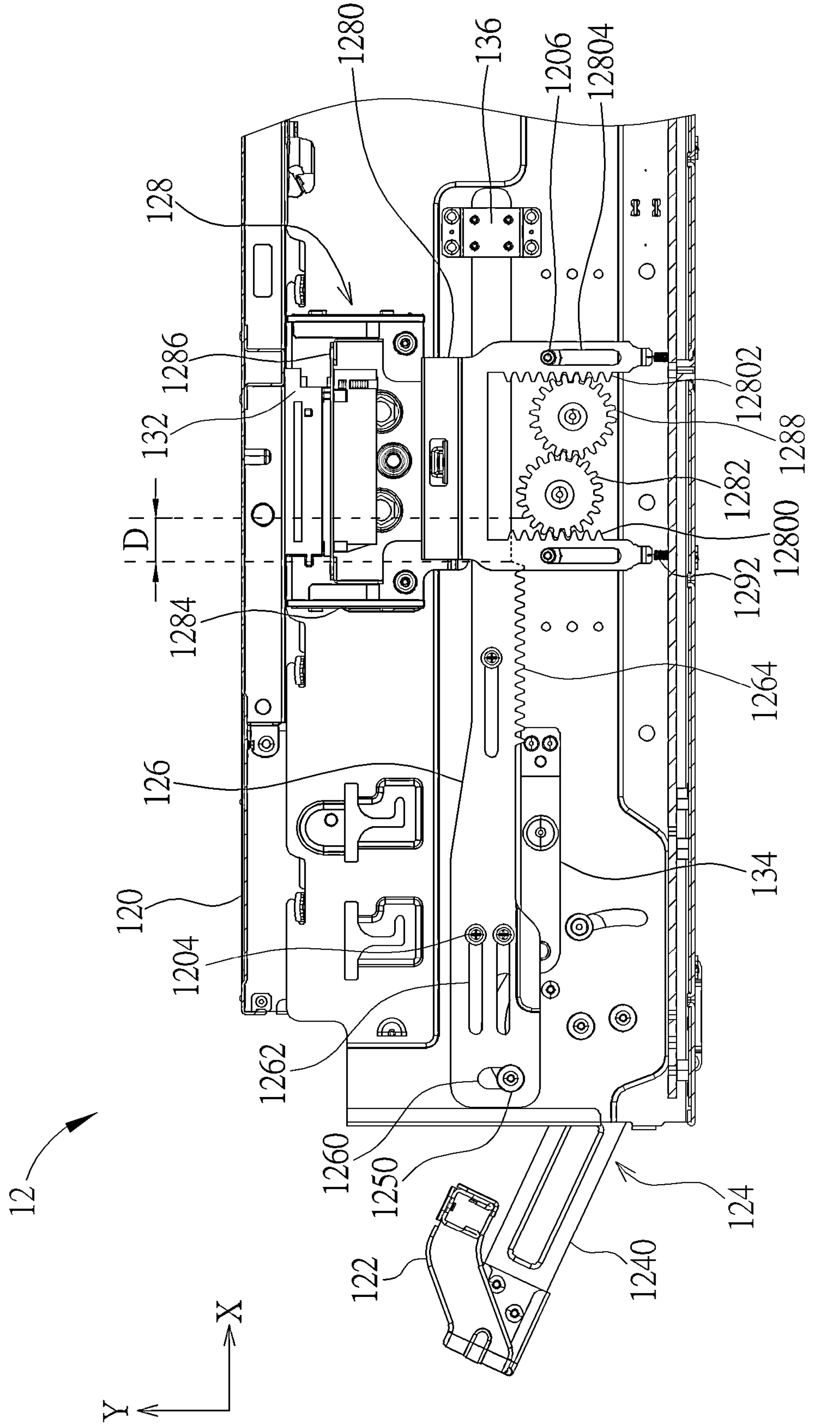
FIG. 9 is an inside view illustrating the handle located at the first position.
Figure 10:
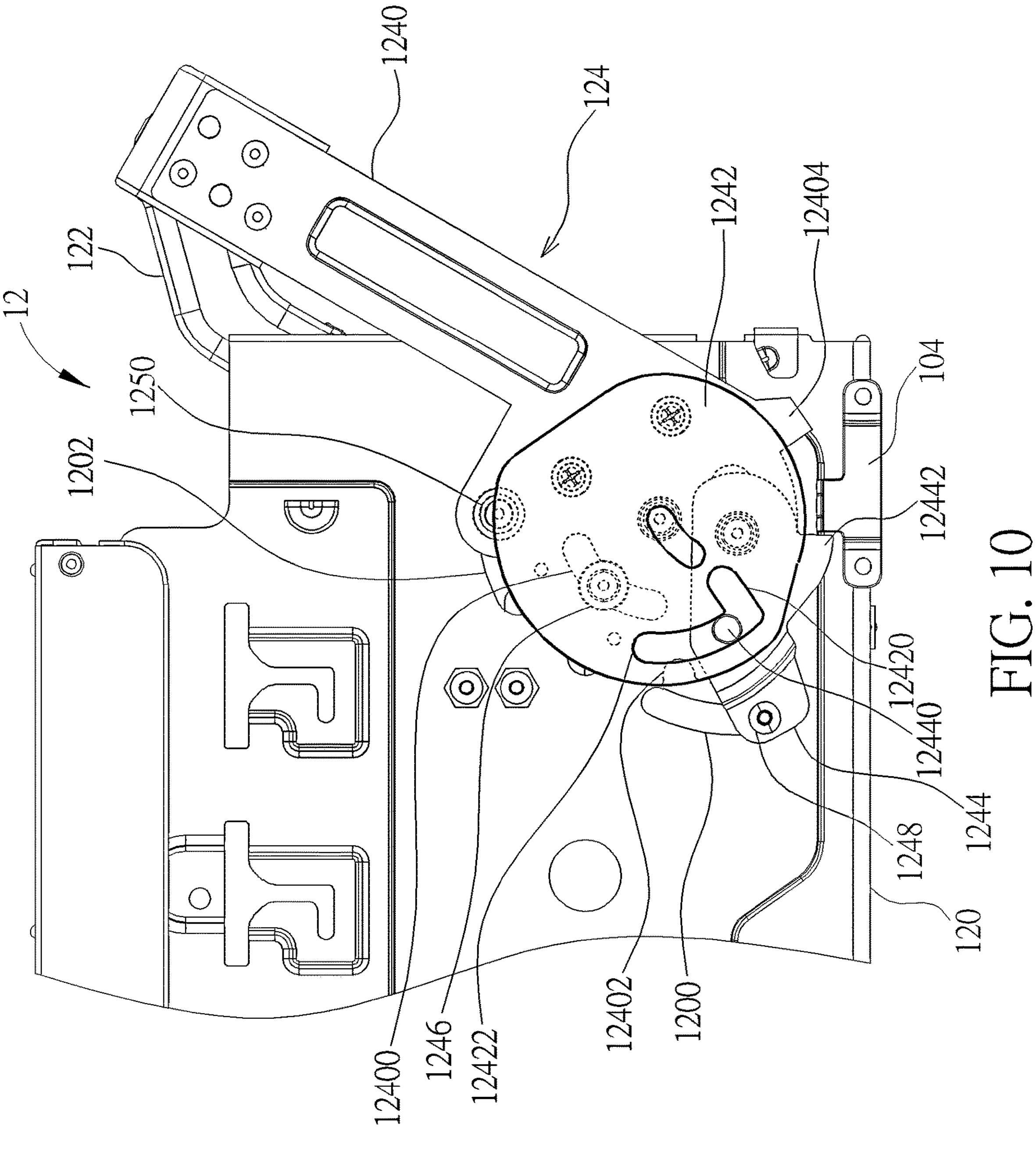
FIG. 10 is an outside view illustrating the handle located at a second position.
Figure 11:
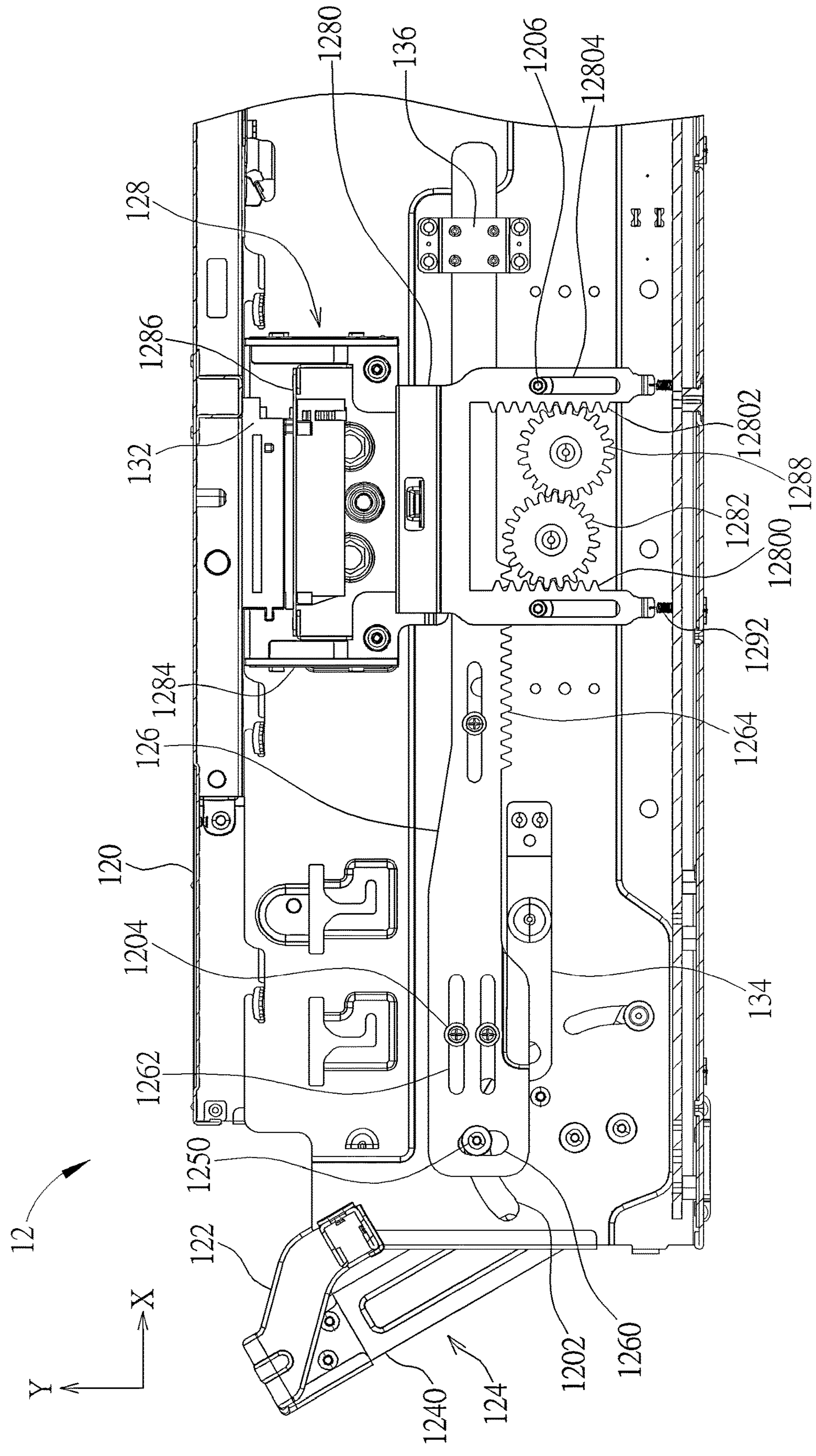
FIG. 11 is an inside view illustrating the handle located at the second position.
Figure 12:
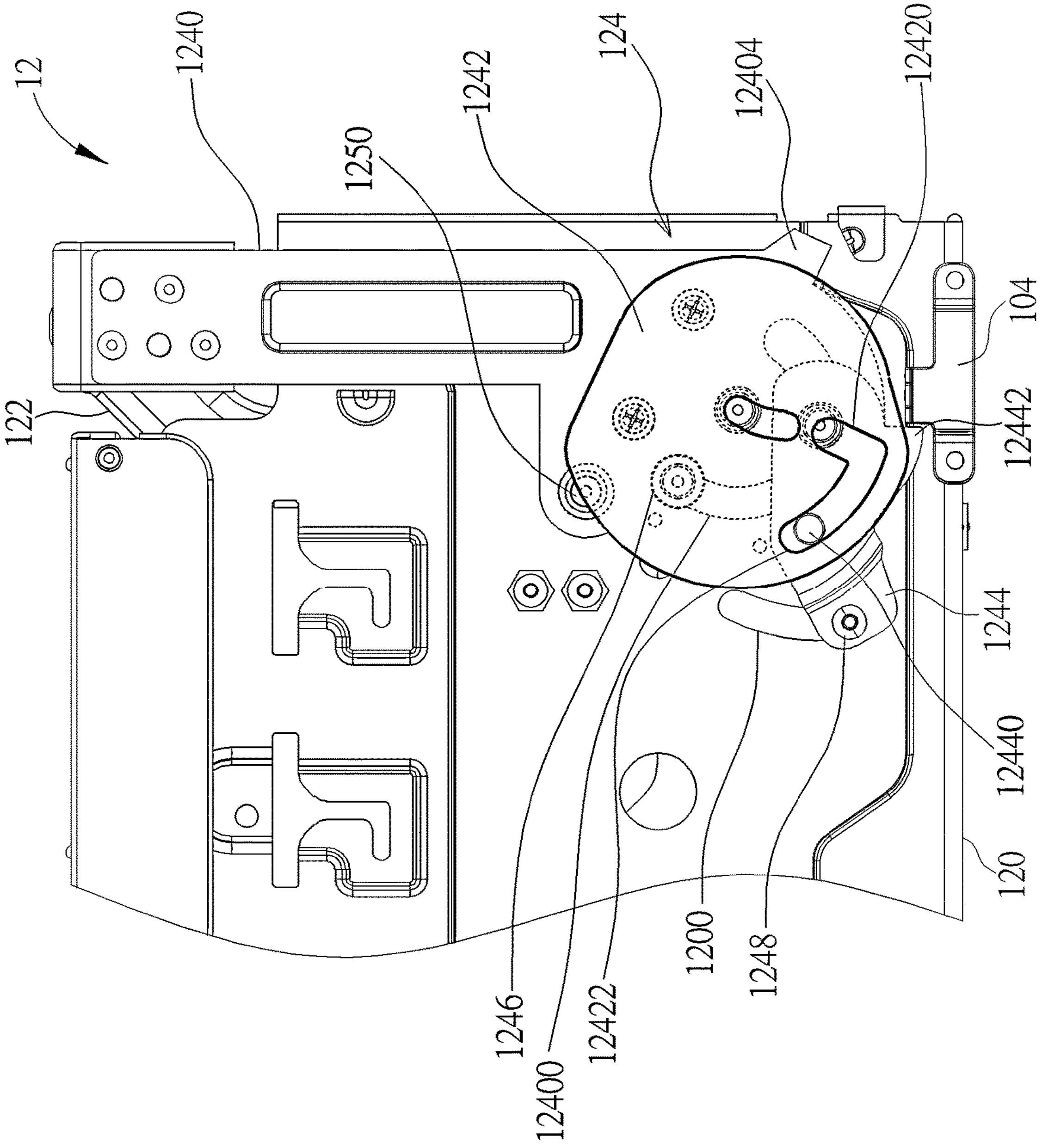
FIG. 12 is an outside view illustrating the handle located at a third position.
Figure 13:
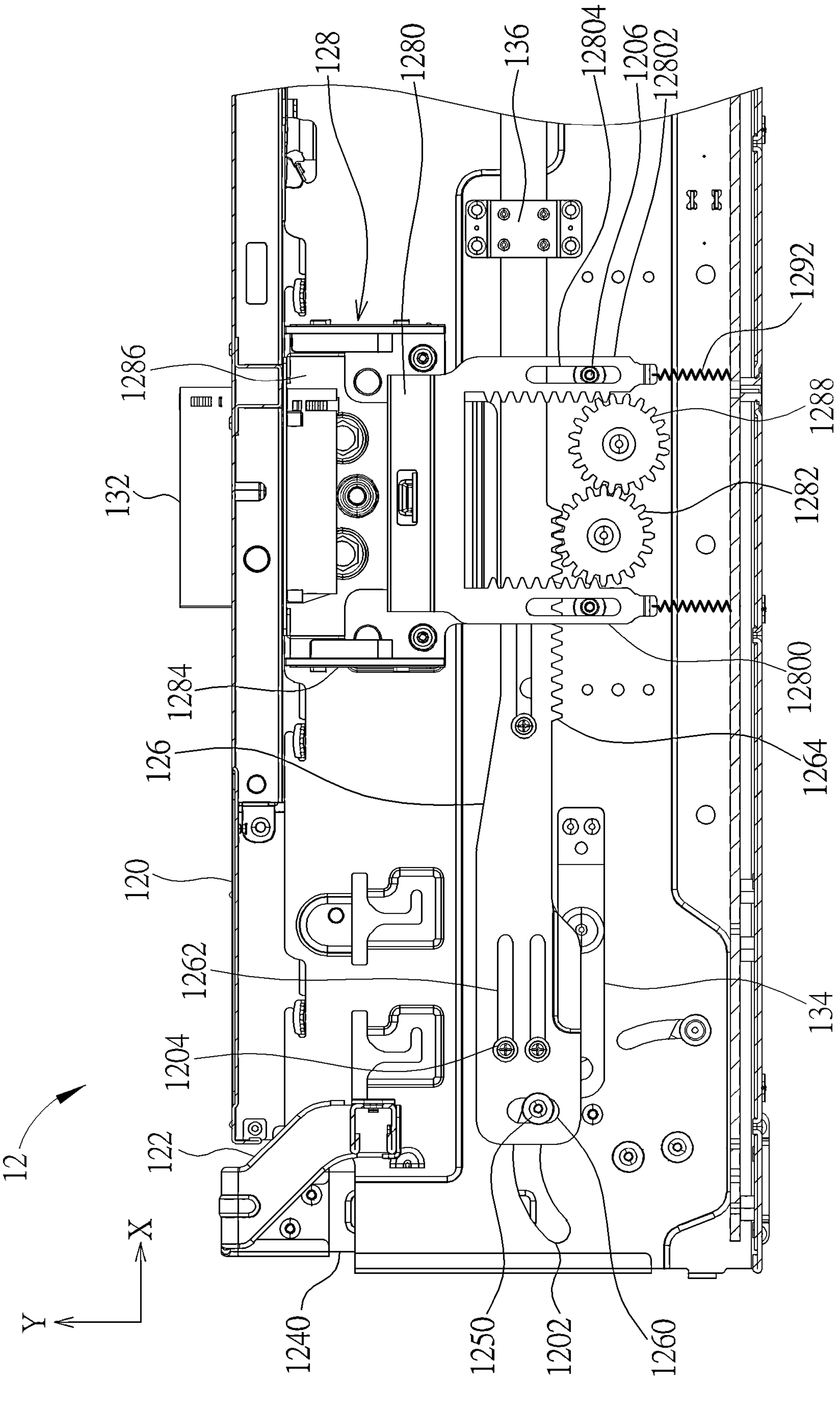
FIG. 13 is an inside view illustrating the handle located at the third position.

As shown in FIGS. 1 to 13, FIG. 1 is a perspective view illustrating an electronic device 1 according to an embodiment of the disclosure, FIG. 2 is an exploded view illustrating the electronic device 1 shown in FIG. 1, FIG. 3 is a perspective view illustrating a casing 10 shown in FIG. 2 from another viewing angle, FIG. 4 is a perspective view illustrating a tray 12 shown in FIG. 2 from another viewing angle, FIG. 5 is a partial exploded view illustrating the tray 12 shown in FIG. 4, FIG. 6 is an inside view illustrating the tray 12 shown in FIG. 4, FIG. 7 is a partial exploded view illustrating the tray 12 shown in FIG. 6, FIG. 8 is an outside view illustrating a handle 122 located at a first position, FIG. 9 is an inside view illustrating the handle 122 located at the first position, FIG. 10 is an outside view illustrating the handle 122 located at a second position, FIG. 11 is an inside view illustrating the handle 122 located at the second position, FIG. 12 is an outside view illustrating the handle 122 located at a third position, and FIG. 13 is an inside view illustrating the handle 122 located at the third position.

As shown in FIGS. 1 and 2, the electronic device 1 comprises a casing 10 and a tray 12. It should be noted that the casing 10 shown in FIG. 1 is only a part of a complete casing of the electronic device 1. In practical applications, the electronic device 1 may be a server or other electronic devices equipped with the tray 12. In this embodiment, the casing 10 may comprise a first electrical connector 100 and a second electrical connector 102, as shown in FIG. 3. For example, the first electrical connector 100 may be an electrical connector of a PCIe base board (PBB) module disposed in front of the casing 10, and the second electrical connector 102 may be an electrical connector of a power supply unit (PSU) disposed above the casing 10. However, the disclosure is not so limited. In general, the electronic device 1 may be further equipped with some necessary hardware and software components for specific purposes, such as a processor, a memory, a circuit board, a power supply, applications, a communication module, etc., and it depends on practical applications.

As shown in FIGS. 4 to 7, the tray 12 comprises a tray body 120, a handle 122, a first transmission mechanism 124, a second transmission mechanism 126, a third transmission mechanism 128, a third electrical connector 130 and a fourth electrical connector 132. The tray body 120 may be disposed in the casing 10 or removed from the casing 10, as shown in FIGS. 1 and 2. The first transmission mechanism 124 is configured to rotatably connect the handle 122 to the tray body 120. The second transmission mechanism 126 is disposed on the tray body 120 and connected to the first transmission mechanism 124. The third transmission mechanism 128 is disposed on the tray body 120 and corresponds to the second transmission mechanism 120. In this embodiment, the first transmission mechanism 124 may be disposed outside the tray body 120, and the second transmission mechanism 126 and the third transmission mechanism 128 may be disposed inside the tray body 120. The third electrical connector 130 is disposed on the tray body 120 and corresponds to the first electrical connector 100 of the casing 10. The fourth electrical connector 132 is disposed on the third transmission mechanism 128 and corresponds to the second electrical connector 102 of the casing 10. For example, a graphics processing unit (GPU) module (not shown) or other electronic modules may be fixed on the tray body 120 of the tray 12 and electrically connected to the third electrical connector 130 and the fourth electrical connector 132.

As shown in FIGS. 8 to 13, when the handle 122 rotates, the first transmission mechanism 124 drives the second transmission mechanism 126 to move along a first direction X and the second transmission mechanism 126 drives the third transmission mechanism 128 to move along a second direction Y perpendicular to the first direction X. When the handle 122 is located at a first position (as shown in FIGS. 8 and 9), the third electrical connector 130 of the tray 12 is separated from the first electrical connector 100 of the casing 10, and the fourth electrical connector 132 of the tray 12 is separated from the second electrical connector 102 of the casing 10. Thus, when the handle 122 is located at the first position, a user may put the tray body 120 of the tray 12 into the casing 10 or remove the tray body 120 of the tray 12 from the casing 10. When the handle 122 rotates from the first position toward a second position (as shown in FIGS. 10 and 11), the first transmission mechanism 124 drives the second transmission mechanism 126 to move along the first direction X, such that the third electrical connector 130 of the tray 12 is connected to the first electrical connector 100 of the casing 10. At this time, the third transmission mechanism 128 remains stationary, such that the fourth electrical connector 132 of the tray 12 is still separated from the second electrical connector 102 of the casing 10. Then, when the handle 122 rotates from the second position toward a third position (as shown in FIGS. 12 and 13), the first transmission mechanism 124 drives the second transmission mechanism 126 to move along the first direction X and the second transmission mechanism 126 drives the third transmission mechanism 128 to move along the second direction Y, such that the fourth electrical connector 132 of the tray 12 is connected to the second electrical connector 102 of the casing 10. On the other hand, when the user wants to disassemble the tray 12 from the casing 10, the user may first rotate the handle 122 from the third position toward the second position to separate the fourth electrical connector 132 of the tray 12 from the second electrical connector 102 of the casing 10, and then rotate the handle 122 from the second position toward the first position to separate the third electrical connector 130 of the tray 12 from the first electrical connector 100 of the casing 10. Accordingly, the user can conveniently and rapidly assemble and disassemble the tray 12.

As shown in FIG. 5, the first transmission mechanism 124 may comprise a driving member 1240, a support member 1242, a rotating member 1244, a first restraining member 1246 and a second restraining member 1248. The driving member 1240 is pivotally connected the tray body 120 and connected to the handle 122, such that the handle 122 can drive the driving member 1240 to rotate with respect to the tray body 120. The support member 1242 is connected to the driving member 1240, such that the support member 1242 can rotate along with the driving member 1240. The rotating member 1244 is pivotally connected to the tray body 120 and located between the driving member 1240 and the support member 1242. Furthermore, the driving portion 1240 may comprise a first restraining groove 12400, and the tray body 120 may comprise a second restraining groove 1200. The first restraining groove 12400 and the second restraining groove 1200 both are arc-shaped. The first restraining member 1246 passes through the first restraining groove 12400 to be fixed on the tray body 120, so as to restrain a rotating range of the driving member 1240. The second restraining member 1248 passes through the second restraining groove 1200 to be fixed on the rotating member 1244, so as to restrain a rotating range of the rotating member 1244.

In this embodiment, the support member 1242 may comprise a first slot 12420 and a second slot 12422, wherein the first slot 12420 is connected to the second slot 12422. The first slot 12420 and the second slot 12422 are connected to each other to be L-shaped. Furthermore, the rotating member 1244 may comprise a driving portion 12440. As shown in FIG. 8, when the handle 122 is located at the first position, the driving portion 12440 of the rotating member 1244 is located in the first slot 12420 of the support member 1242. Still further, the tray 12 may further comprise a lock member 134 disposed on the tray body 120. In this embodiment, the lock member 134 may be an elastic sheet and an end of the lock member 134 is fixed on the tray body 120. The lock member 134 may comprise an engaging portion 1340 and the driving member 1240 may comprise an engaging recess 12402. As shown in FIG. 8, when the handle 122 is located at the first position, the engaging portion 1340 engages with the engaging recess 12402 to lock the driving member 1240.

In this embodiment, the interior of the casing 10 may comprise a stop member 104 and an unlock portion 106, as shown in FIG. 2. Furthermore, the driving member 1240 may comprise a stop portion 12404. When the handle 122 is located at the first position and the tray 12 is pushed into the casing 10, the stop member 104 stops the stop portion 12404 to restrain the tray 12 from moving, as shown in FIGS. 1 and 8. When the tray 12 is pushed into the casing 10, the unlock portion 106 drives the lock member 134 to move toward an inside of the tray 12, such that the engaging portion 1340 disengages from the engaging recess 12402 to unlock the driving member 1240. At this time, the driving member 1240 can rotate with respect to the tray body 120.

Then, a user may rotate the handle 122 from the first position (as shown in FIG. 8) toward the second position (as shown in FIG. 10). When the handle 122 rotates from the first position toward the second position, the first slot 12420 of the support member 1242 drives the driving portion 12440 to drive the rotating member 1244 to rotate, such that the driving portion 12440 moves away from the first slot 12420 and enters the second slot 12422, as shown in FIG. 10. In this embodiment, the rotating member 1244 may comprise a pushing portion 12442. Ehen the handle 122 rotates from the first position toward the second position, the stop portion 12404 of the driving member 1240 moves away from the stop member 104 and the pushing portion 12442 of the rotating member 1244 drives the stop member 104 to drive the tray body 120 to move toward the inside of the casing 10, such that the third electrical connector 130 of the tray 12 is connected to the first electrical connector 100 of the casing 10.

As shown in FIGS. 5 to 7, the tray body 120 may comprise a guiding groove 1202, the second transmission mechanism 126 may comprise a linking groove 1260, and the first transmission mechanism 124 may further comprise a linking member 1250. The linking member 1250 is disposed on the driving member 1240 and passes through the guiding groove 1202 and the linking groove 1260. The guiding groove 1202 may be arc-shaped and the linking groove 1260 may extend along the second direction Y. Thus, when the handle 122 rotates, the linking member 1250 moves along the guiding groove 1202 and drives the linking groove 1260 to drive the second transmission mechanism 126 to move along the first direction X, as shown in FIGS. 9, 11 and 13. In this embodiment, the tray 12 may further comprise a fixing member 136 fixed on the tray body 120. An end of the second transmission mechanism 126 is movably located between the tray body 120 and the fixing member 136. Furthermore, the second transmission mechanism 126 may comprise at least one first positioning groove 1262, and the tray body 120 may comprise at least one first positioning portion 1204. The first positioning groove 1262 extends along the first direction X and the first positioning portion 1204 is disposed in the first positioning groove 1262, so as to position the second transmission mechanism 126 on the tray body 120. Accordingly, the second transmission mechanism 126 can move along the first direction X. It should be noted that the number and position of the first positioning portions 1204 and the first positioning grooves 1262 may be determined according to practical applications, so the disclosure is not limited to the embodiment shown in the figure.

As shown in FIG. 7, the second transmission mechanism 126 may comprise a driving gear rack 1264, and the third transmission mechanism 128 may comprise a moving member 1280, a first gear 1282, a socket 1284, a carrier member 1286, a second gear 1288, a cover 1290 and an elastic member 1292. The moving member 1280 comprises a first driven gear rack 12800 and a second driven gear rack 12802. In this embodiment, the moving member 1280 may be U-shaped, and the first driven gear rack 12800 is opposite to the second driven gear rack 12802. The first gear 1282 and the second gear 1288 are disposed between the first driven gear rack 12800 and the second driven gear rack 12802, wherein the first gear 1282 meshes with the first driven gear rack 12800, and the second gear 1288 meshes with the second driven gear rack 12802 and the first gear 1282. Furthermore, the moving member 1280 may comprise at least one second positioning groove 12804 and the tray body 120 may comprise at least one second positioning portion 1206. The second positioning groove 12804 extends along the second direction Y and the second positioning portion 1206 is disposed in the second positioning groove 12804, so as to position the moving member 1280 on the tray body 120. Accordingly, the third transmission mechanism 128 can move along the second direction Y. It should be noted that the number and position of the second positioning portions 1206 and the second positioning grooves 12804 may be determined according to practical applications, so the disclosure is not limited to the embodiment shown in the figure.

The socket 1284 comprises a rail 12840 and the carrier member 1286 has a sliding portion 12860. An end of the carrier member 1286 is connected to the moving member 1280 and the sliding portion 12860 is disposed in the rail 12840. Accordingly, the moving member 1280 can drive the carrier member 1286 to move with respect to the socket 1284. It should be noted that the number of the sliding portions 12860 and the rails 12840 may be determined according to practical applications, so the disclosure is not limited to the embodiment shown in the figure. The cover 1290 is configured to cover the first driven gear rack 12800, the second driven gear rack 12802, the first gear 1282 and the second gear 1288. In this embodiment, the second transmission mechanism, 126 may comprise two elastic members 1292, wherein opposite ends of one elastic member 1292 are respectively connected to the first driven gear rack 12800 and the cover 1290, and opposite ends of the other elastic member 1292 are respectively connected to the second driven gear rack 12802 and the cover 1292. The elastic member 1292 may be, but is not limited to, a spring.

As shown in FIG. 9, when the handle 122 is located at the first position, the driving gear rack 1264 is separated from the first gear 1282 by a predetermined distance D. At this time, the driving gear rack 1264 does not mesh with the first gear 1282. As shown in FIG. 11, when the handle 122 rotates from the first position toward the second position, the linking member 1250 of the first transmission mechanism 124 drives the second transmission mechanism 126 to move the predetermined distance D rightward along the first direction X, such that the driving gear rack 1264 meshes with the first gear 1282. Thus, when the handle 122 rotates between the first position and the second position, the driving gear rack 1264 does not mesh with the first gear 1282, such that the third transmission mechanism 128 remains stationary.

As mentioned in the above, when the handle 122 rotates from the first position toward the second position, the pushing portion 12442 of the rotating member 1244 drives the stop member 104 to drive the tray body 120 to move toward the inside of the casing 10, such that the third electrical connector 130 of the tray 12 is connected to the first electrical connector 100 of the casing 10. Then, the user may continue to rotate the handle 122 from the second position (as shown in FIGS. 10 and 11) toward the third position (as shown in FIGS. 12 and 13). When the handle 122 rotates from the second position toward the third position, the first transmission mechanism 124 drives the second transmission mechanism 126 to move rightward along the first direction X. At this time, the driving gear rack 1264 drives the first gear 1282 to rotate, and the first gear 1282 drives the second gear 1288 to rotate. At the same time, the first gear 1282 drives the first driven gear rack 12800 to move upward along the second direction Y, and the second gear 1288 also drives the second driven gear rack 12802 to move upward along the second direction Y, such that the moving member 1280 drives the carrier member 1286 to move upward along the second direction Y. Accordingly, the carrier member 1286 drives the fourth electrical connector 132 of the tray 12 to move upward along the second direction Y, such that the fourth electrical connector 132 of the tray 12 is connected to the second electrical connector 102 of the casing 10. Consequently, the assembly of the tray 12 and the casing 10 is completed.

As shown in FIGS. 10 and 12, when the handle 122 rotates between the second position and the third position, the driving portion 12440 of the rotating member 1244 is located in the second slot 12422 of the support member 1242 without restriction (i.e. the driving portion 12440 can move freely in the second slot 12422), such that the rotating member 1244 remains stationary.

When the user wants to disassemble the tray 12 from the casing 10, the user may first rotate the handle 122 from the third position (as shown in FIGS. 12 and 13) toward the second position (as shown in FIGS. 10 and 11). When the handle 122 rotates from the third position toward the second position, the first transmission mechanism 124 drives the second transmission mechanism 126 to move leftward along the first direction X. At this time, the driving gear rack 1264 drives the first gear 1282 to rotate, and the first gear 1282 drives the second gear 1288 to rotate. At the same time, the first gear 1282 drives the first driven gear rack 12800 to move downward along the second direction Y, and the second gear 1288 also drives the second driven gear rack 12802 to move downward along the second direction Y, such that the moving member 1280 drives the carrier member 1286 to move downward along the second direction Y. Accordingly, the carrier member 1286 drives the fourth electrical connector 132 of the tray 12 to move downward along the second direction Y, such that the fourth electrical connector 132 of the tray 12 is separated from the second electrical connector 102 of the casing 10. When the handle 122 is located at the second position, the driving gear rack 1264 begins to disengage from the first gear 1282. The disclosure may use the elastic member 1292 to keep the moving member 1280 at the best position where the driving gear rack 1264 can mesh with the first gear 1282.

Then, the user may continue to rotate the handle 122 from the second position (as shown in FIGS. 10 and 11) toward the first position (as shown in FIGS. 8 and 9). When the handle 122 rotates from the second position toward the first position, the support member 1242 drives the driving portion 12440 to drive the rotating member 1244 to rotate, such that the driving portion 12440 moves away from the second slot 12422 and enters the first slot 12420, as shown in FIG. 8. Furthermore, when the handle 122 rotates from the second position toward the first position, the pushing portion 12442 of the rotating member 1244 moves away from the stop member 104 and the stop portion 12404 of the driving member 1240 drives the stop member 104 to drive the tray body 120 to move toward the outside of the casing 10, such that the third electrical connector 130 of the tray 12 is separated from the first electrical connector 100 of the casing 10. Accordingly, the user can disassemble the tray 12 from the casing 10.

Figure 14:
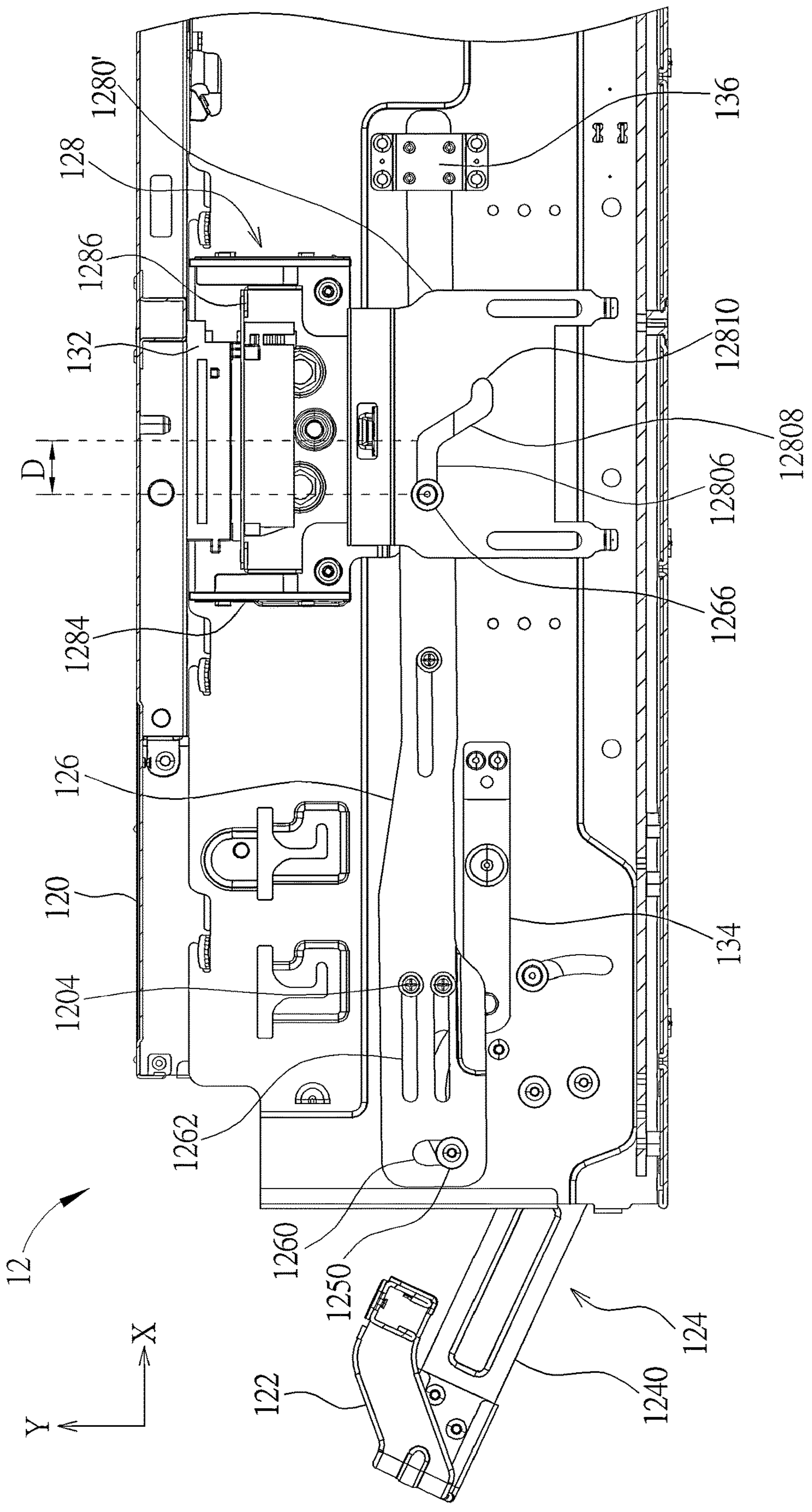
FIG. 14 is an inside view illustrating the handle located at the first position according to another embodiment of the disclosure.
Figure 15:
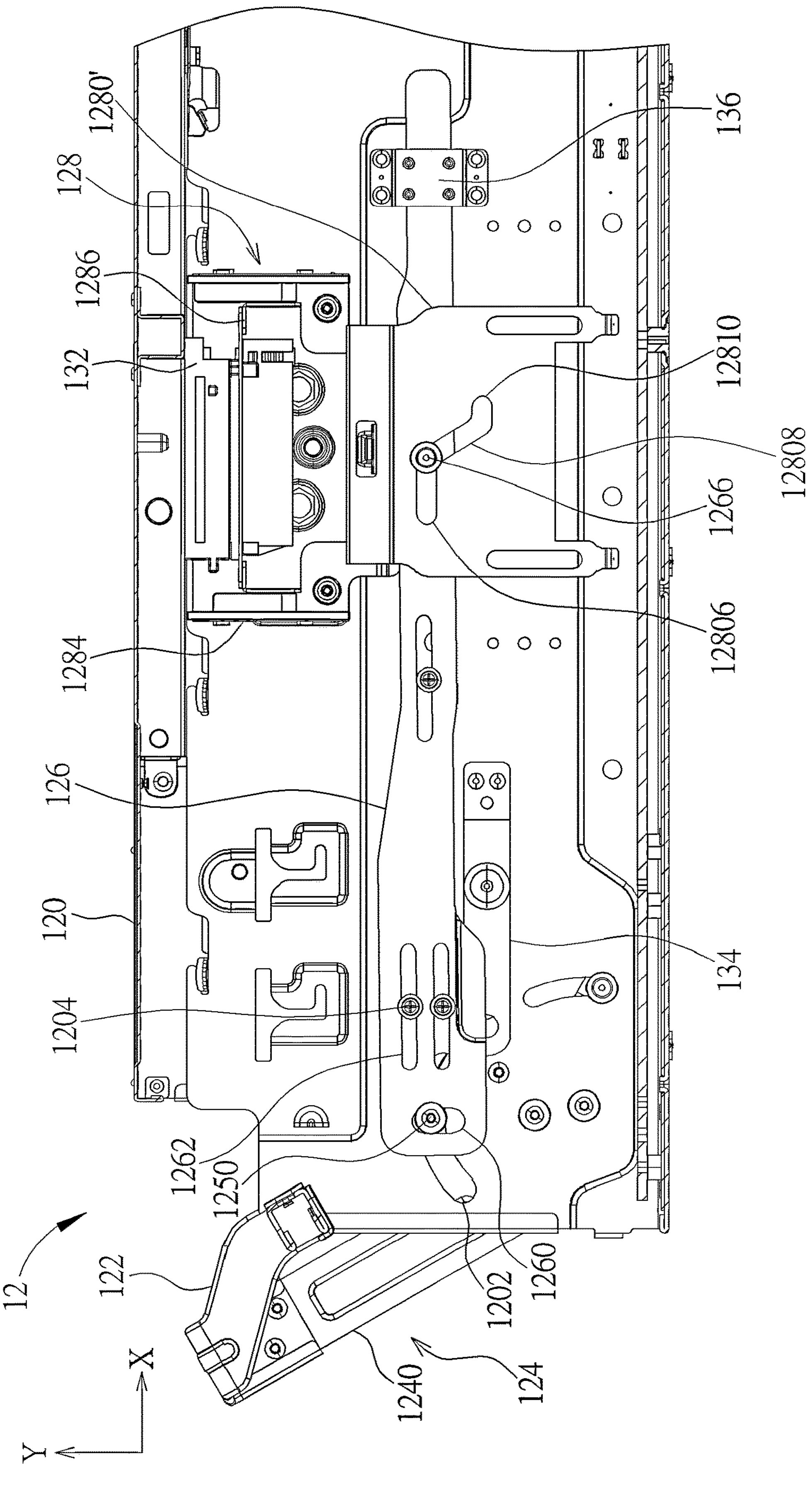
FIG. 15 is an inside view illustrating the handle located at the second position according to another embodiment of the disclosure.
Figure 16:
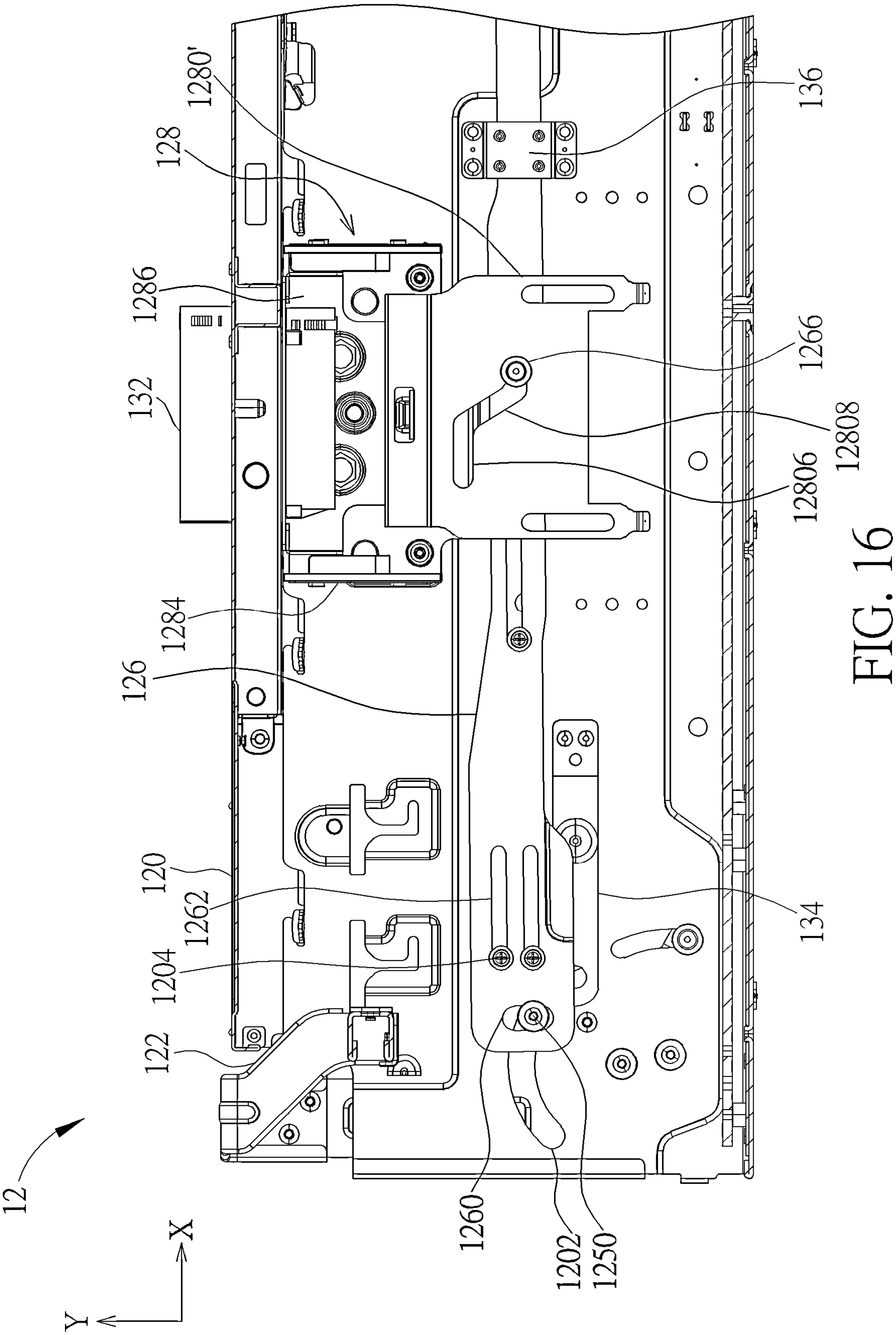
FIG. 16 is an inside view illustrating the handle located at the third position according to another embodiment of the disclosure.

Referring to FIGS. 14 to 16, FIG. 14 is an inside view illustrating the handle 122 located at the first position according to another embodiment of the disclosure, FIG. 15 is an inside view illustrating the handle 122 located at the second position according to another embodiment of the disclosure, and FIG. 16 is an inside view illustrating the handle 122 located at the third position according to another embodiment of the disclosure.

As shown in FIGS. 14 to 16, the disclosure may replace the aforesaid moving member 1280 by a moving member 1280', and the second transmission mechanism 126 comprises a driving rod 1266. In this embodiment, the disclosure may omit the driving gear rack 1264, the first gear 1282, the second gear 1288, the first driven gear rack 12800 and the second driven gear rack 12802 mentioned in the above. In this embodiment, the moving member 1280' may comprise a straight slot 12806, an inclined slot 12808 and a retaining recess 12810, wherein the straight slot 12806 is connected to the inclined slot 12808, and the inclined slot 12808 is connected to the retaining recess 12810. The straight slot 12806 extends along the first direction X, and the inclined slot 12808 is inclined downward with respect to the first direction X. It should be noted that the same elements in FIGS. 14-16 and FIGS. 8-13 are represented by the same numerals, so the repeated explanation will not be depicted herein again.

As shown in FIG. 14, when the handle 122 is located at the first position, the driving rod 1266 is located at a side of the straight slot 12806 and separated from the inclined slot 12808 by a predetermined distance D. As shown in FIG. 15, when the handle 122 rotates from the first position toward the second position, the linking member 1250 of the first transmission mechanism 124 drives the second transmission mechanism 126 to move the predetermined distance D rightward along the first direction X, such that the driving rod 1266 moves to the inclined slot 12808. Thus, when the handle 122 rotates between the first position and the second position, the driving rod 1266 is located in the straight slot 12806 without restriction, such that the third transmission mechanism 128 remains stationary. As shown in FIG. 16, when the handle 122 rotates from the second position toward the third position, the linking member 1250 of the first transmission mechanism 124 drives the second transmission mechanism 126 to move rightward along the first direction X, and the driving rod 1266 pushes the inclined slot 12808 rightward, such that the moving member 1280' drives the carrier member 1286 to move upward along the second direction Y. When the handle 122 is located at the third position, the driving rod 1266 is retained in the retaining recess 12810.

On the contrary, when the handle 122 rotates from the third position toward the second position, the linking member 1250 of the first transmission mechanism 124 drives the second transmission mechanism 126 to move leftward along the first direction X, and the driving rod 1266 is separated from the retaining recess 12810 to push the inclined slot 12808 leftward, such that the moving member 1280' drives the carrier member 1286 to move downward along the second direction Y. When the handle 122 rotates from the second position toward the first position, the linking member 1250 of the first transmission mechanism 124 drives the second transmission mechanism 126 to move the predetermined distance D leftward along the first direction X, such that the driving rod 1266 moves to the position shown in FIG. 14.

As mentioned in the above, the disclosure may dispose the first electrical connector and the second electrical connector on the casing, dispose the third electrical connector on the tray body of the tray, and dispose the fourth electrical connector on the third transmission mechanism of the tray, wherein the third electrical connector corresponds to the first electrical connector and the fourth electrical connector corresponds to the second electrical connector. When a user puts the tray into the casing, the user may rotate the handle from the first position toward the second position. At this time, the first transmission mechanism drives the second transmission mechanism to move along the first direction, such that the third electrical connector is connected to the first electrical connector. Then, the user may rotate the handle from the second position toward the third position. At this time, the first transmission mechanism drives the second transmission mechanism to move along the first direction and the second transmission mechanism drives the third transmission mechanism to move along the second direction, such that the fourth electrical connector is connected to the second electrical connector. On the other hand, when the user wants to disassemble the tray from the casing, the user may first rotate the handle from the third position toward the second position to separate the fourth electrical connector from the second electrical connector, and then rotate the handle from the second position toward the first position to separate the third electrical connector from the first electrical connector. Accordingly, the user can conveniently and rapidly assemble and disassemble the tray.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:
- a casing; and
- a tray comprising:
  - a tray body disposed in the casing;
  - a handle;
  - a first transmission mechanism configured to rotatably connect the handle to the tray body;
  - a second transmission mechanism disposed on the tray body and connected to the first transmission mechanism; and
  - a third transmission mechanism disposed on the tray body and corresponding to the second transmission mechanism;
- wherein, when the handle rotates, the first transmission mechanism drives the second transmission mechanism to move along a first direction, and, after the handle rotates with a predetermined trajectory, the second transmission mechanism drives the third transmission mechanism to move along a second direction perpendicular to the first direction.

2. The electronic device of claim 1, wherein the casing comprises a first electrical connector and a second electrical connector, the tray comprises a third electrical connector and a fourth electrical connector, the third electrical connector is disposed on the tray body and corresponds to the first electrical connector, the fourth electrical connector is disposed on the third transmission mechanism and corresponds to the second electrical connector;
- wherein, when the handle is located at a first position, the third electrical connector is separated from the first electrical connector, and the fourth electrical connector is separated from the second electrical connector;
- wherein, when the handle rotates from the first position toward a second position, the first transmission mechanism drives the second transmission mechanism to move along the first direction, such that the third electrical connector is connected to the first electrical connector;
- wherein, when the handle rotates from the second position toward a third position, the first transmission mechanism drives the second transmission mechanism to move along the first direction, and the second transmission mechanism drives the third transmission mechanism to move along the second direction perpendicular to the first direction, such that the fourth electrical connector is connected to the second electrical connector.

3. The electronic device of claim 1, wherein the first transmission mechanism comprises:
- a driving member pivotally connected the tray body and connected to the handle;
- a support member connected to the driving member, the support member comprising a first slot and a second slot, the first slot being connected to the second slot; and
- a rotating member pivotally connected to the tray body and located between the driving member and the support member, the rotating member comprising a driving portion;
- wherein, when the handle is located at the first position, the driving portion is located in the first slot;
- wherein, when the handle rotates from the first position toward the second position, the first slot drives the driving portion to drive the rotating member to rotate;
- wherein, when the handle rotates between the second position and the third position, the driving portion is located in the second slot without restriction.

4. The electronic device of claim 3, wherein the driving portion comprises a first restraining groove, the tray body comprises a second restraining groove, the first transmission mechanism further comprises a first restraining member and a second restraining member, the first restraining member passes through the first restraining groove to be fixed on the tray body, and the second restraining member passes through the second restraining groove to be fixed on the rotating member.

5. The electronic device of claim 3, wherein the casing comprises a stop member, the driving member comprises a stop portion, and the rotating member comprises a pushing portion;
- wherein, when the handle is located at the first position and the tray is pushed into the casing, the stop member stops the stop portion to restrain the tray from moving;

wherein, when the handle rotates from the first position toward the second position, the stop portion moves away from the stop member and the pushing portion drives the stop member to drive the tray body to move toward an inside of the casing.

6. The electronic device of claim 3, wherein the casing comprises an unlock portion, the tray further comprises a lock member disposed on the tray body, the lock member comprises an engaging portion, the driving member comprises an engaging recess, and the engaging portion engages with the engaging recess to lock the driving member;

wherein, when the tray is pushed into the casing, the unlock portion drives the lock member to move, such that the engaging portion disengages from the engaging recess to unlock the driving member.

7. The electronic device of claim 3, wherein the tray body comprises a guiding groove, the second transmission mechanism comprises a linking groove, the first transmission mechanism further comprises a linking member, and the linking member is disposed on the driving member and passes through the guiding groove and the linking groove;

wherein, when the handle rotates, the linking member moves along the guiding groove and drives the linking groove to drive the second transmission mechanism to move.

8. The electronic device of claim 1, wherein the second transmission mechanism comprises a driving gear rack, the third transmission mechanism comprises:

a moving member comprising a first driven gear rack;

a first gear meshing with the first driven gear rack;

a socket comprising a rail; and a carrier member connected to the moving member, the carrier member having a sliding portion disposed in the rail;

wherein, when the handle is located at the first position, the driving gear rack is separated from the first gear by a predetermined distance;

wherein, when the handle rotates from the first position toward the second position, the first transmission mechanism drives the second transmission mechanism to move the predetermined distance along the first direction;

wherein, when the handle rotates from the second position toward the third position, the first transmission mechanism drives the second transmission mechanism to move along the first direction, the driving gear rack drives the first gear to rotate, and the first gear drives the first driven gear rack to move along the second direction, such that the moving member drives the carrier member to move along the second direction.

9. The electronic device of claim 8, wherein the moving member further comprises a second driven gear rack, the third transmission mechanism further comprises a second gear, and the second gear meshes with the second driven gear rack and the first gear.

10. The electronic device of claim 8, wherein the third transmission mechanism further comprises a cover and an elastic member, the cover covers the first driven gear rack and the first gear, and opposite ends of the elastic member are respectively connected to the first driven gear rack and the cover.

11. The electronic device of claim 1, wherein the second transmission mechanism comprises a driving rod, the third transmission mechanism comprises:

a moving member comprising a straight slot and an inclined slot, the straight slot being connected to the inclined slot;

a socket comprising a rail; and a carrier member connected to the moving member, the carrier member having a sliding portion disposed in the rail;

wherein, when the handle is located at the first position, the driving rod is located at a side of the straight slot and separated from the inclined slot by a predetermined distance;

wherein, when the handle rotates from the first position toward the second position, the first transmission mechanism drives the second transmission mechanism to move the predetermined distance along the first direction, such that the driving rod moves to the inclined slot;

wherein, when the handle rotates from the second position toward the third position, the first transmission mechanism drives the second transmission mechanism to move along the first direction, and the driving rod pushes the inclined slot, such that the moving member drives the carrier member to move along the second direction.

12. The electronic device of claim 1, wherein the first transmission mechanism comprises a driving member, a support member and a rotating member, the driving member is pivotally connected to the tray body and connected to the handle, the support member is connected to the driving member, the support member comprises a first slot and a second slot, the first slot is connected to the second slot, the rotating member is pivotally connected to the tray body and located between the driving member and the support member, the rotating member comprises a driving portion, the second transmission mechanism comprises a driving gear rack, the third transmission mechanism comprises a moving member, a first gear, a socket and a carrier member, the moving member comprises a first driven gear rack, the first gear meshes with the first driven gear rack, the socket comprises a rail, the carrier member is connected to the moving member, the carrier member has a sliding portion, and the sliding portion is disposed in the rail.

13. A tray comprising:

a tray body;

a handle;

a first transmission mechanism configured to rotatably connect the handle to the tray body;

a second transmission mechanism disposed on the tray body and connected to the first transmission mechanism; and a third transmission mechanism disposed on the tray body and corresponding to the second transmission mechanism;

wherein, when the handle rotates, the first transmission mechanism drives the second transmission mechanism to move along a first direction, and, after the handle rotates with a predetermined trajectory, the second transmission mechanism drives the third transmission mechanism to move along a second direction perpendicular to the first direction.

14. The tray of claim 13, wherein the first transmission mechanism comprises:

a driving member pivotally connected the tray body and connected to the handle;

a support member connected to the driving member, the support member comprising a first slot and a second slot, the first slot being connected to the second slot; and a rotating member pivotally connected to the tray body and located between the driving member and the support member, the rotating member comprising a driving portion;

wherein, when the handle is located at a first position, the driving portion is located in the first slot;

wherein, when the handle rotates from the first position toward a second position, the first slot drives the driving portion to drive the rotating member to rotate;

wherein, when the handle rotates between the second position and a third position, the driving portion is located in the second slot without restriction.

15. The tray of claim 14, wherein the driving portion comprises a first restraining groove, the tray body comprises a second restraining groove, the first transmission mechanism further comprises a first restraining member and a second restraining member, the first restraining member passes through the first restraining groove to be fixed on the tray body, and the second restraining member passes through the second restraining groove to be fixed on the rotating member.

16. The tray of claim 14, further comprising a lock member disposed on the tray body, wherein the lock member comprises an engaging portion, the driving member comprises an engaging recess, and the engaging portion engages with the engaging recess to lock the driving member.

17. The tray of claim 14, wherein the tray body comprises a guiding groove, the second transmission mechanism comprises a linking groove, the first transmission mechanism further comprises a linking member, and the linking member is disposed on the driving member and passes through the guiding groove and the linking groove;

wherein, when the handle rotates, the linking member moves along the guiding groove and drives the linking groove to drive the second transmission mechanism to move.

18. The tray of claim 13, wherein the second transmission mechanism comprises a driving gear rack, the third transmission mechanism comprises:

a moving member comprising a first driven gear rack;

a first gear meshing with the first driven gear rack;

a socket comprising a rail; and a carrier member connected to the moving member and disposed in the rail;

wherein, when the handle is located at a first position, the driving gear rack is separated from the first gear by a predetermined distance;

wherein, when the handle rotates from the first position toward a second position, the first transmission mechanism drives the second transmission mechanism to move the predetermined distance along the first direction;

wherein, when the handle rotates from the second position toward a third position, the first transmission mechanism drives the second transmission mechanism to move along the first direction, the driving gear rack drives the first gear to rotate, and the first gear drives the first driven gear rack to move along the second direction, such that the moving member drives the carrier member to move along the second direction.

19. The tray of claim 13, wherein the second transmission mechanism comprises a driving rod, the third transmission mechanism comprises:

a moving member comprising a straight slot and an inclined slot, the straight slot being connected to the inclined slot;

a socket comprising a rail; and a carrier member connected to the moving member and disposed in the rail;

wherein, when the handle is located at a first position, the driving rod is located at a side of the straight slot and separated from the inclined slot by a predetermined distance;

wherein, when the handle rotates from the first position toward a second position, the first transmission mechanism drives the second transmission mechanism to move the predetermined distance along the first direction, such that the driving rod moves to the inclined slot;

wherein, when the handle rotates from the second position toward a third position, the first transmission mechanism drives the second transmission mechanism to move along the first direction, and the driving rod pushes the inclined slot, such that the moving member drives the carrier member to move along the second direction.

20. The tray of claim 13, wherein the first transmission mechanism comprises a driving member, a support member and a rotating member, the driving member is pivotally connected to the tray body and connected to the handle, the support member is connected to the driving member, the support member comprises a first slot and a second slot, the first slot is connected to the second slot, the rotating member is pivotally connected to the tray body and located between the driving member and the support member, the rotating member comprises a driving portion, the second transmission mechanism comprises a driving gear rack, the third transmission mechanism comprises a moving member, a first gear, a socket and a carrier member, the moving member comprises a first driven gear rack, the first gear meshes with the first driven gear rack, the socket comprises a rail, the carrier member is connected to the moving member, the carrier member has a sliding portion, and the sliding portion is disposed in the rail.

* * * * *